(12) United States Patent
Stott et al.

(10) Patent No.: US 9,728,687 B2
(45) Date of Patent: Aug. 8, 2017

(54) QUANTUM PLATELET CONVERTER

(71) Applicant: Seoul Semiconductor Co., Ltd., Ansan-si (KR)

(72) Inventors: Nathan Stott, Ansan-si (KR); Won Cheol Seo, Ansan-si (KR); Ji Hye An, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 0 days.

(21) Appl. No.: 15/153,372

(22) Filed: May 12, 2016

(65) Prior Publication Data

US 2016/0336492 A1  Nov. 17, 2016

Related U.S. Application Data

(60) Provisional application No. 62/161,202, filed on May 13, 2015.

(51) Int. Cl.
*H01L 33/00* (2010.01)
*H01L 33/50* (2010.01)
*B82Y 20/00* (2011.01)

(52) U.S. Cl.
CPC ............ *H01L 33/507* (2013.01); *B82Y 20/00* (2013.01); *H01L 33/502* (2013.01); *Y10S 977/774* (2013.01); *Y10S 977/821* (2013.01); *Y10S 977/824* (2013.01); *Y10S 977/95* (2013.01)

(58) Field of Classification Search
CPC ..... H01L 33/507; H01L 33/502; H01L 33/54; H01L 33/58
USPC .......................................................... 257/98
See application file for complete search history.

(56) References Cited

U.S. PATENT DOCUMENTS

| | | | | |
|---|---|---|---|---|
| 2011/0273864 A1* | 11/2011 | Izawa | ................ | C09K 11/7741 362/84 |
| 2012/0032142 A1* | 2/2012 | Leatherdale | .......... | H01L 27/156 257/13 |
| 2014/0151729 A1* | 6/2014 | Orsley | .................. | H01L 33/505 257/98 |
| 2014/0367721 A1* | 12/2014 | Mahler | .................. | B82Y 30/00 257/98 |
| 2015/0129916 A1* | 5/2015 | Bera | ..................... | H01L 33/504 257/98 |
| 2016/0201881 A1* | 7/2016 | Brown | ..................... | G09G 3/00 362/84 |

\* cited by examiner

*Primary Examiner* — Tu-Tu Ho
(74) *Attorney, Agent, or Firm* — Perkins Coie LLP (57) ABSTRACT

In one aspect a light emitting device includes a light emitting diode (LED) chip, and an encapsulant covering the LED chip. The encapsulant is embedded with a downconverter. The downconverter includes a quasi-two dimensional quantum nanoplatelet structure.

17 Claims, 14 Drawing Sheets

QUANTUM PLATELET CONVERTER

CROSS REFERENCE TO RELATED APPLICATIONS

This patent application claims the benefit of U.S. Provisional Patent Application No. 62/161,202, filed May 13, 2015, entitled "QUANTUM PLATELET CONVERTER." The entire content of the aforementioned patent application is incorporated by reference in its entirety as part of the disclosure of this application.

TECHNICAL FIELD

This patent document relates to downconverters in a light emitting device.

BACKGROUND

In a light emitting diode (LED) device package, a light transmitting layer can be used as an encapsulant to function as a matrix for a downconverter, such as phosphors. Examples of materials for the light transmitting layer that acts as an encapsulant include silicon materials. Phosphor materials can be embedded in the encapsulant to function as a downconverter. The silicon material can act as an encapsulant to protect the LED device and can act as a polymer matrix for the phosphor materials to convert blue light emitted by LEDs in the LED device to green, yellow, and red lights, the mixture of which are perceived as white light, for example.

SUMMARY

Examples of implementations of the disclosed technology provide for quasi-two dimensional quantum nanoplatelet structures and materials that can be implemented as a downconverter in an LED device package. The quasi-two dimensional quantum nanoplatelet structures and materials can be implemented as an on-chip downconverter or a remote (i.e., off-chip) downconverter for down converting blue lights emitted by LEDs to green, yellow, and red lights.

In one aspect, a light emitting device includes a light emitting diode (LED) chip, and one or more downconverters embedded in an encapsulant for encapsulating the LED chip. The downconverter includes a quasi-two dimensional quantum nanoplatelet structure.

The light emitting device can be implemented in various ways to include one or more of the following features. The downconverter can down convert a blue light emitted by the LED chip to at least one of red, yellow, or green lights. The downconverter can include an on-chip downconverter. The downconverter can include a remote downconverter. The quasi-two dimensional quantum nanoplatelet structure of the downconverter can include a core material covered by at least one shell layer. The quasi-two dimensional quantum nanoplatelet structure of the downconverter can include a nanosphere core covered by a nanoplatelet shell. The quasi-two dimensional quantum nanoplatelet structure of the downconverter can include a nanoplatelet core covered by a nanoplatelet shell. The quasi-two dimensional quantum nanoplatelet structure of the downconverter can include a nanorod core covered by a nanoplatelet shell. The quasi-two dimensional quantum nanoplatelet structure can include a cadmium-based material. The cadmium-based material can include: ((CdSe)CdS)ZnS, ((CdSe)CdZnS)ZnS, (CdSe)CdS, (CdSe)ZnS, or a combination of two or more aforementioned materials. The quasi-two dimensional quantum nanoplatelet structure can include a cadmium-free material. The cadmium-free material can include: ((InP)GaP)ZnS, (InP)GaP, (InP)ZnS, ((InP)InGaP)ZnS, (InP)InGaP, or a combination of two or more aforementioned materials.

In another aspect, a light emitting device includes a light emitting diode (LED) chip including: a substrate, and a light emitting structure disposed over a surface of the substrate. The light emitting device includes an encapsulant covering the LED chip. One or more downconverters are embedded into the encapsulant and include a quasi-two dimensional quantum nanoplatelet structure.

The light emitting device can be implemented to include one or more of the following features. For example, the emitting structure can be disposed on a bottom surface of the substrate. The light emitting device can include a heat dissipation metal structure disposed to be in contact with the light emitting structure. The heat dissipation metal structure can be electrically connected to a current supply to apply a current to the light emitting structure. The light emitting device can include a reflector structure disposed to cover at least a portion of the downconverter. The reflector structure can guide light in a given direction.

In another aspect, a light emitting device includes a substrate, a light emitting structure disposed over a surface of the substrate, and a wavelength converting layer disposed over the light emitting structure. The wavelength converting layer includes a quasi-two dimensional quantum nanoplatelet structure.

The light emitting device can be implemented to include one or more of the following features. For example, a transparent layer can be disposed between the wavelength converting layer and the light emitting structure. The light emitting device can include an optical guide disposed over the wavelength converting layer.

In another aspect, a light emitting device includes a light emitting structure; and a wavelength converting layer disposed over the light emitting structure. The wavelength converting layer can include a quasi-two dimensional quantum nanoplatelet structure.

The light emitting device can be implemented in various ways to include one or more of the following features. For example, the wavelength covering layer can include a plate structure. The light emitting device can include an adhesive layer disposed between the wavelength covering layer and the light emitting structure. The light emitting device can include an air gap disposed between the wavelength covering layer and the light emitting structure.

DETAILED DESCRIPTION

Quantum platelet converters (QPC) are semiconductor nanocrystals that possess unique optical properties. QPCs can be implemented using different quantum dot heterostructures (QDH) including quantum dots (or quantum spheres), quantum rods, and quantum platelets (or nanoplatelets). QDHs can be structured so that the emission can be tuned to emit light at desired wavelengths in different optical spectrums with narrow emission spectra by controlling the size (e.g., length, width, and height) of a particular QDH.

Figure 1:
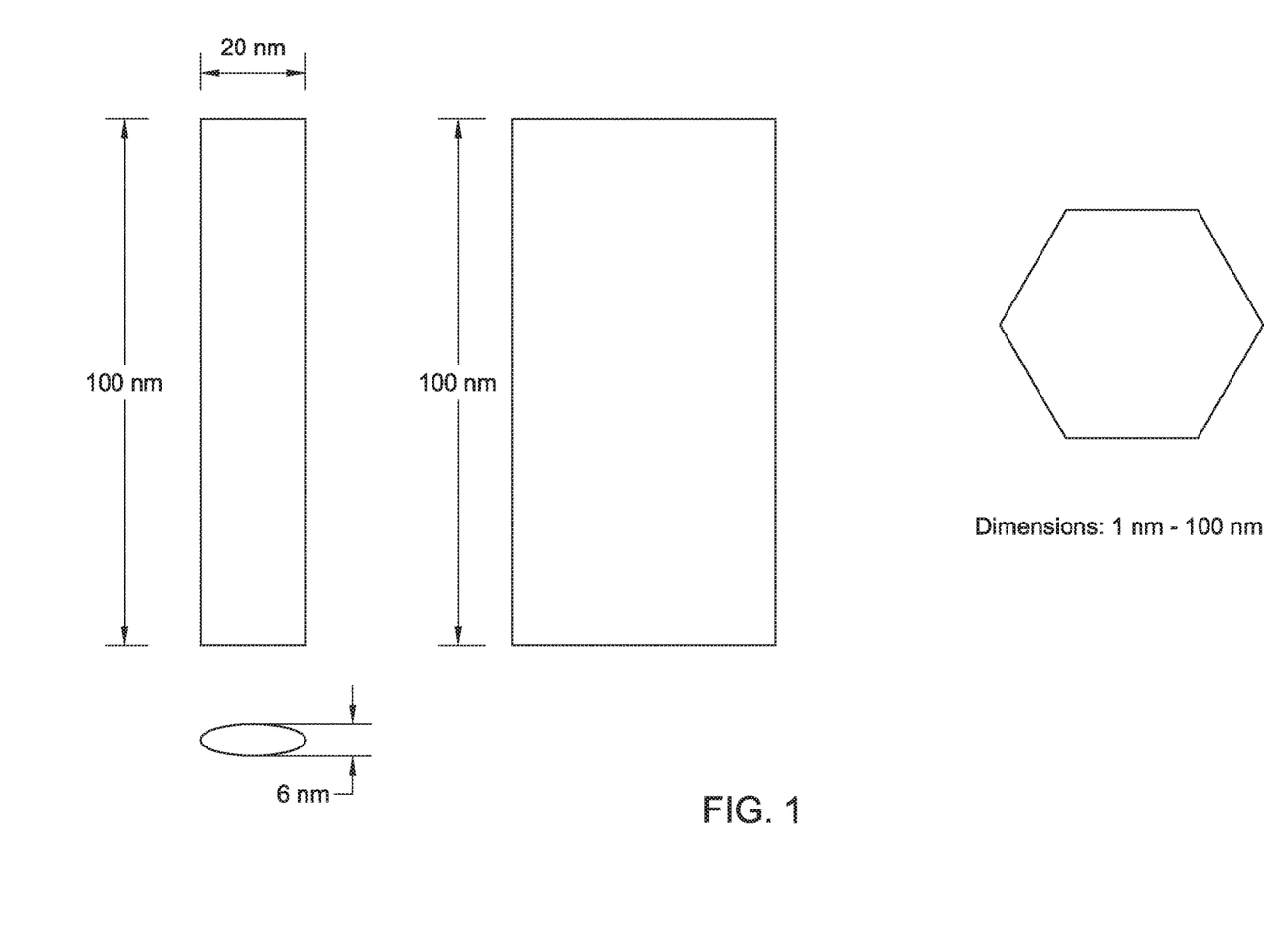
FIG. 1 shows an exemplary quantum dot heterostructure (QDH).

FIG. 1 shows examples of QDH 100 with various sizes including the length, width, and height that range from 1 nm to 100 nm. Quantum dots are quasi-zero dimensional, quantum rods are quasi-one dimensional, and quantum platelets (or nanoplatelets) are quasi-two dimensional.

Exemplary Materials for Quasi-Two Dimensional Quantum Nanoplatelet Structures

Suitable quasi-2 dimensional quantum nanoplatelet structures can be implemented using cadmium (Cd)-based or Cd-free materials. Examples of Cd-based and Cd-free materials for the disclosed Quasi-Two Dimensional Quantum Nanoplatelet Structures are provided in Table 1 below (Se=Selenium, S=Sulfur, Zn=Zinc, In=Indium, P=Phosphate, and Ga=Gallium):

TABLE 1

Exemplary Materials for Quasi-Two Dimensional Quantum Nanoplatelet Structures

| Cd-based Quantum Nanoplatelets | Cd-free Quantum Nanoplatelets |
|---|---|
| ((CdSe)CdS)ZnS | ((InP)GaP)ZnS |
| (CdSe)CdZnS | (InP)GaP |
| ((CdSe)CdZnS)ZnS | (InP)ZnS |
| (CdSe)CdS | ((InP)InGaP)ZnS |
| (CdSe)ZnS | (InP)InGaP |

Compared to Cd-free materials (e.g., In-based materials), Cd-based materials tend to be of a better quality, likely possess a higher quantum efficiency, or likely exhibit a narrower optical spectral bandwidth as measured by the full width half maximum (FWHM). Due to the sensitivity of In to air, the In-based materials can be processed in an air-free environment to enhance the quantum efficiency and narrow the FWHM to be closer to Cd-based materials. In addition, a layer of GaP can be provided over a layer of InP, which is then covered with ZnS as shell material layers to achieve near 90% of the quantum efficiency of Cd-based materials while reducing the FWHM from around 60 nm to 40 nm.

Advantages of Quasi-Two Dimensional Quantum Nanoplatelets

Quasi-two dimensional nanomaterials tend to have a large surface area with a greater percentage of the surface area than the core material. Having a large surface area provides for more dangling bonds at the surface of the crystal structure, and thus the surface is at a much higher energy state than a surface of a typical block of bulk material. Due to the high energy state, the surface is more reactive requiring more action to fall back to a lower energy state. As the dimensionality of the QDH increases from quasi-zero to quasi-one and quasi-two dimensions, there are simply more materials to the structure which leads to a larger size. With the larger size, the percentage of the surface area compared to the core material is reduced. The larger size of the quasi-two dimensional quantum nanoplatelets allows for an increased or enhanced robustness for better reliability under high temperature and light flux applications when compared to quantum dots or rods. The enhanced robustness is due to the quasi-two dimensional quantum nanoplatelets being more impervious to oxidation and degradation. In other words, the failure mechanism of the quantum nanoplatelet materials is reduced. In some implementations, different materials that are less susceptible to degradation or oxidation can be attached to the surface of the quasi-two dimensional quantum nanoplatelets to further enhance the robustness.

The disclosed quasi-two dimensional quantum nanoplatelet structures can include different materials, e.g., at least 3 or 4 different materials, to enhance the robustness and protect against degradation during high temperature and high flux blue light environment of an LED device. An exemplary quasi-two dimensional quantum nanoplatelet structure can include: a core material, a first shell layer, and a second shell layer. The first shell layer can always be a nanoplatelet structure. The second shell layer covering the first shell layer is selected to help with stability and have the right band-gap. In some implementations, a third shell layer of a metal oxide can cover the second shell layer. Alternatively, the core material with the first and second shell layers can be embedded in a metal oxide microsphere.

In addition, DHs of different geometries, such as different combinations of (core)shell or (core)shell 1 shell 2 configurations can be used to provide for a greater tunability for the downconverter. Moreover, the quasi-two dimensional quantum nanoplatelet structures provide for a greater flexibility in different geometry combinations of core and shell than the quasi-zero or quasi-one dimensional structures. Examples of the (core)shell or (core)shell 1 shell 2 configurations include (nanoplatelet)-nanoplatelet, (nanorod)-nanoplatelet, and (nanosphere)-nanoplatelet structures. The quasi-two dimensional quantum nanoplatelet structures can have low reabsorption to minimal reabsorption. For example, a nanoplatelet shell on a nanoplatelet core structure can provide a large red shift (e.g., 60 nm Stokes shift) with reduced reabsorption for a red light emitting device (LED). The quasi-two dimensional quantum nanoplatelet structures make it easier to create green QDH "phosphors" by a minimal red shift depending on the (core)shell or (core)shell 1 shell 2 configurations. For example, when a sphere core is used inside a nanoplatelet shell, the reabsorption may be greatly reduced and even more than (nanoplatelet) nanoplatelet or (nanorod) nanoplatelet while producing very little red shift (e.g., 10 nm Stokes shift) for producing green light and red light emitting devices. The small red shift can be important for creating a green light emitting device.

Figure 2:
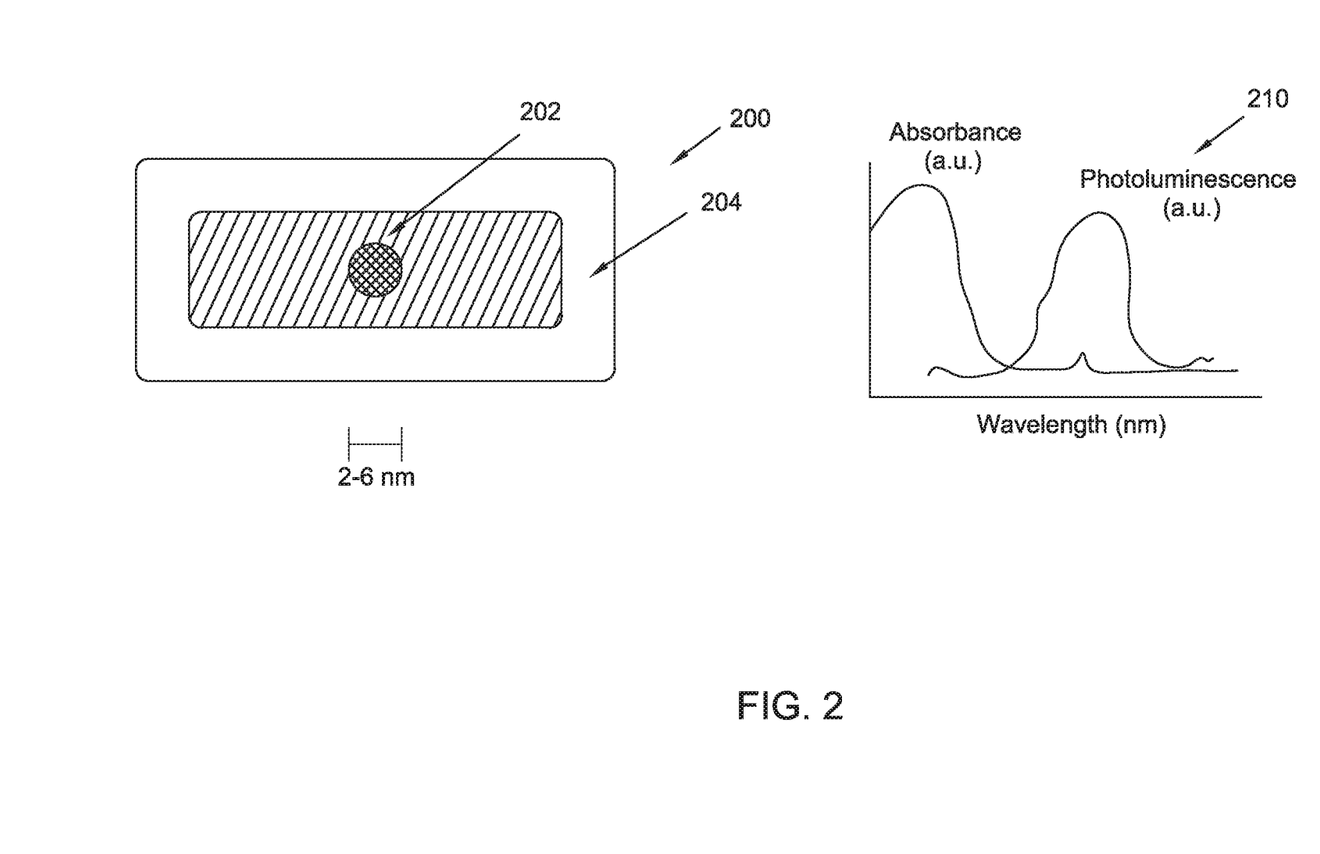
FIG. 2 shows an exemplary quasi-two dimensional nanoplatelet QDH with a nanosphere core covered with a nanoplatelet shell.

FIG. 2 shows an exemplary quasi-two dimensional nanoplatelet QDH 200 with a nanosphere core 202 covered with a nanoplatelet shell 204. FIG. 2 also shows an absorbance vs. photoluminescence relationship 210 for the QDH 200 having a (nanosphere core 202) covered with a nanoplatelet shell 204.

Figure 3:
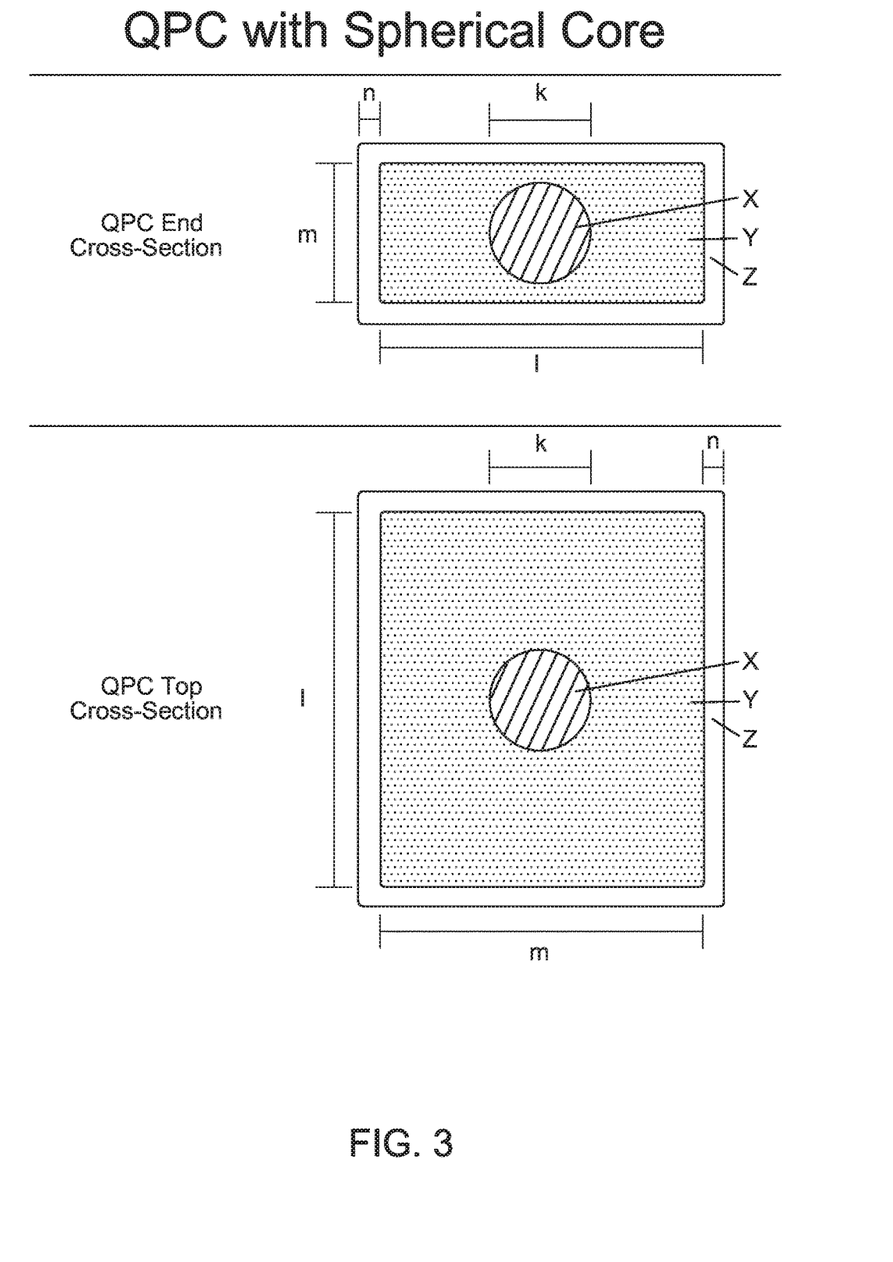
FIG. 3 shows an end cross-section and a top cross-section of another exemplary QDH with a (nanosphere core) covered with nanoplatelet shell.

FIG. 3 shows an end cross-section 320 and a top cross-section 330 of another exemplary QDH with a (nanosphere core 322) covered with nanoplatelet shell 324. A stabilizing second shell layer 326 covers the nanoplatelet shell 324.

Figure 4:
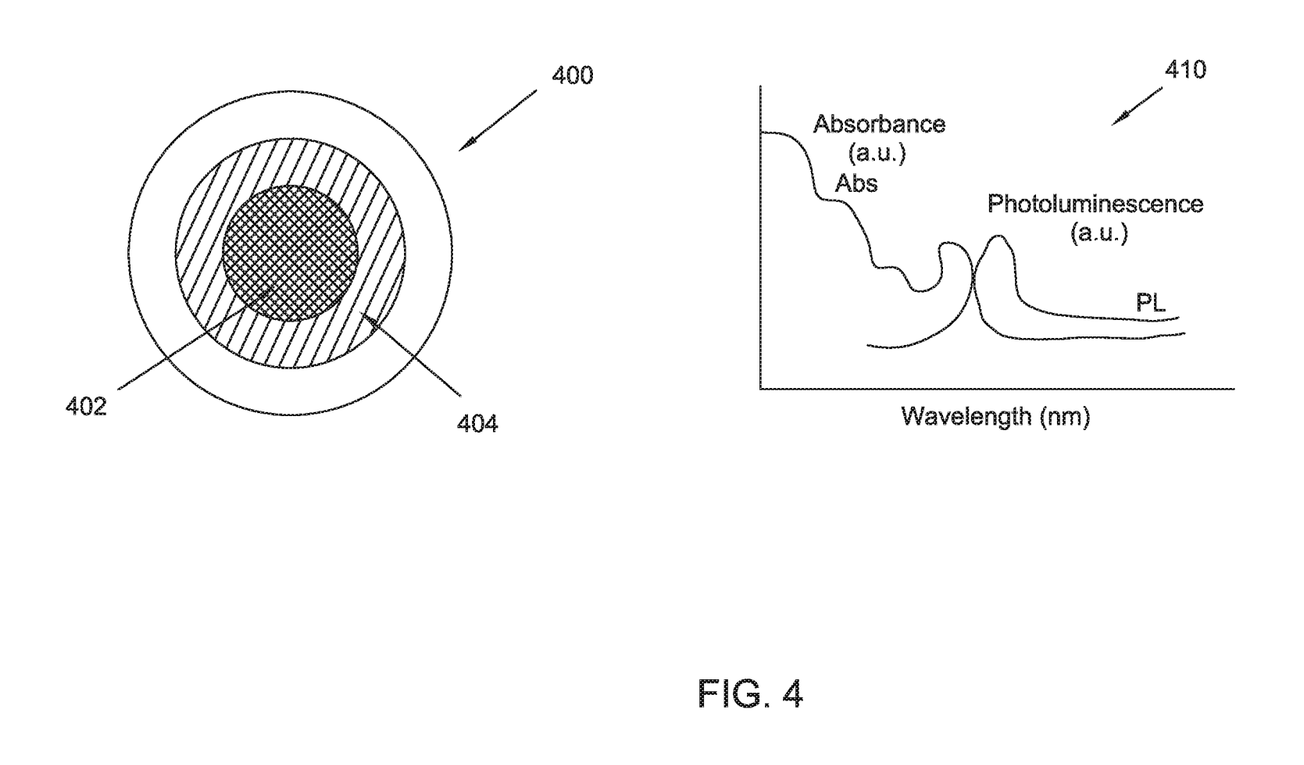
FIG. 4 shows an exemplary quasi-two dimensional nanoplatelet QDH with a nanosphere core covered with a nanosphere shell.

FIG. 4 shows an exemplary quasi-two dimensional nanoplatelet QDH 400 with a nanosphere core 402 covered with a nanosphere shell 404. FIG. 4 also shows an absorbance vs. photoluminescence relationship 410 for the QDH 400 having a (nanosphere core 402) covered with a nanosphere shell 404.

Figure 5:
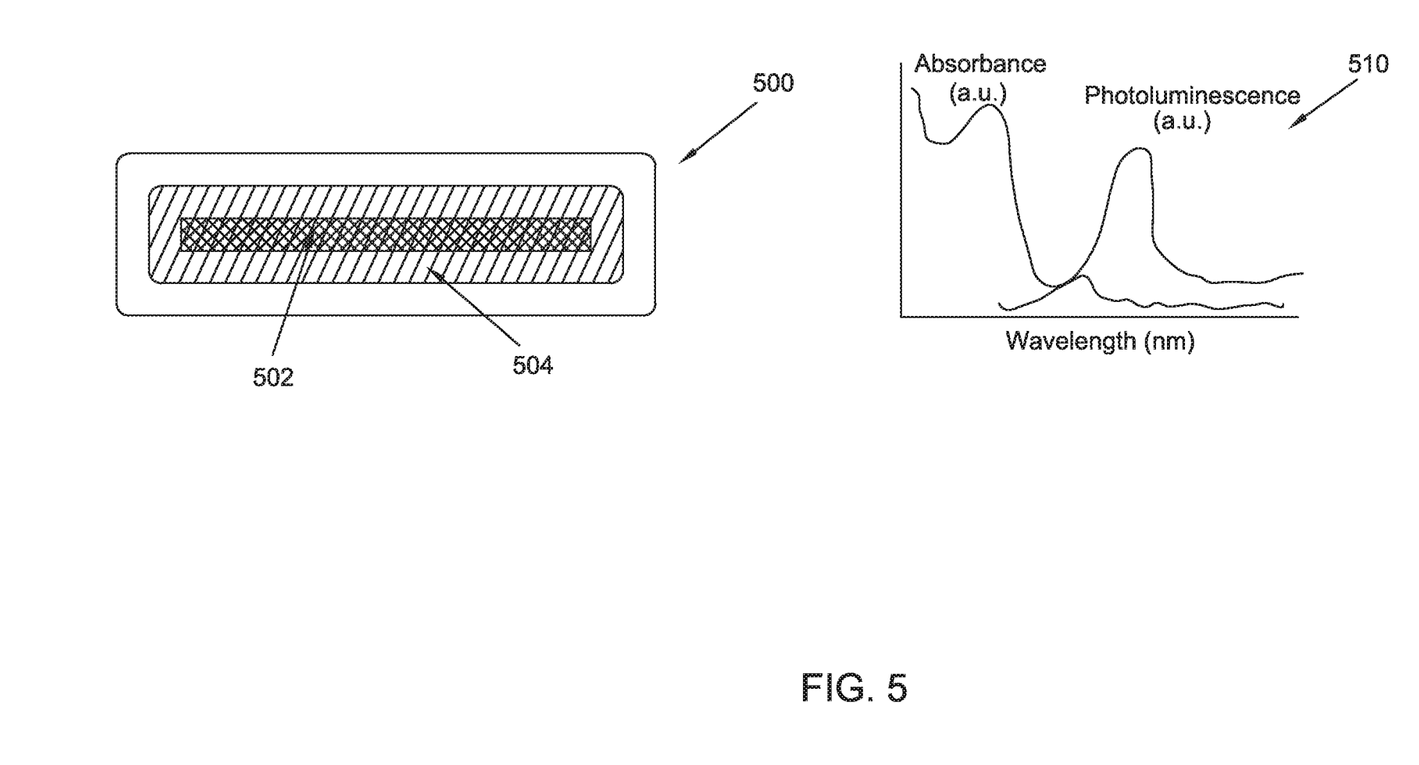
FIG. 5 shows an exemplary quasi-two dimensional nanoplatelet QDH with a nanosplatelet core covered with a nanoplatelet shell.

FIG. 5 shows an exemplary quasi-two dimensional nanoplatelet QDH 500 with a nanosplatelet core 502 covered with a nanoplatelet shell 504. FIG. 5 also shows an absorbance vs. photoluminescence relationship 510 for the QDH 500 having a (nanosplatelet core 502) covered with a nanoplatelet shell 504.

Figure 6:
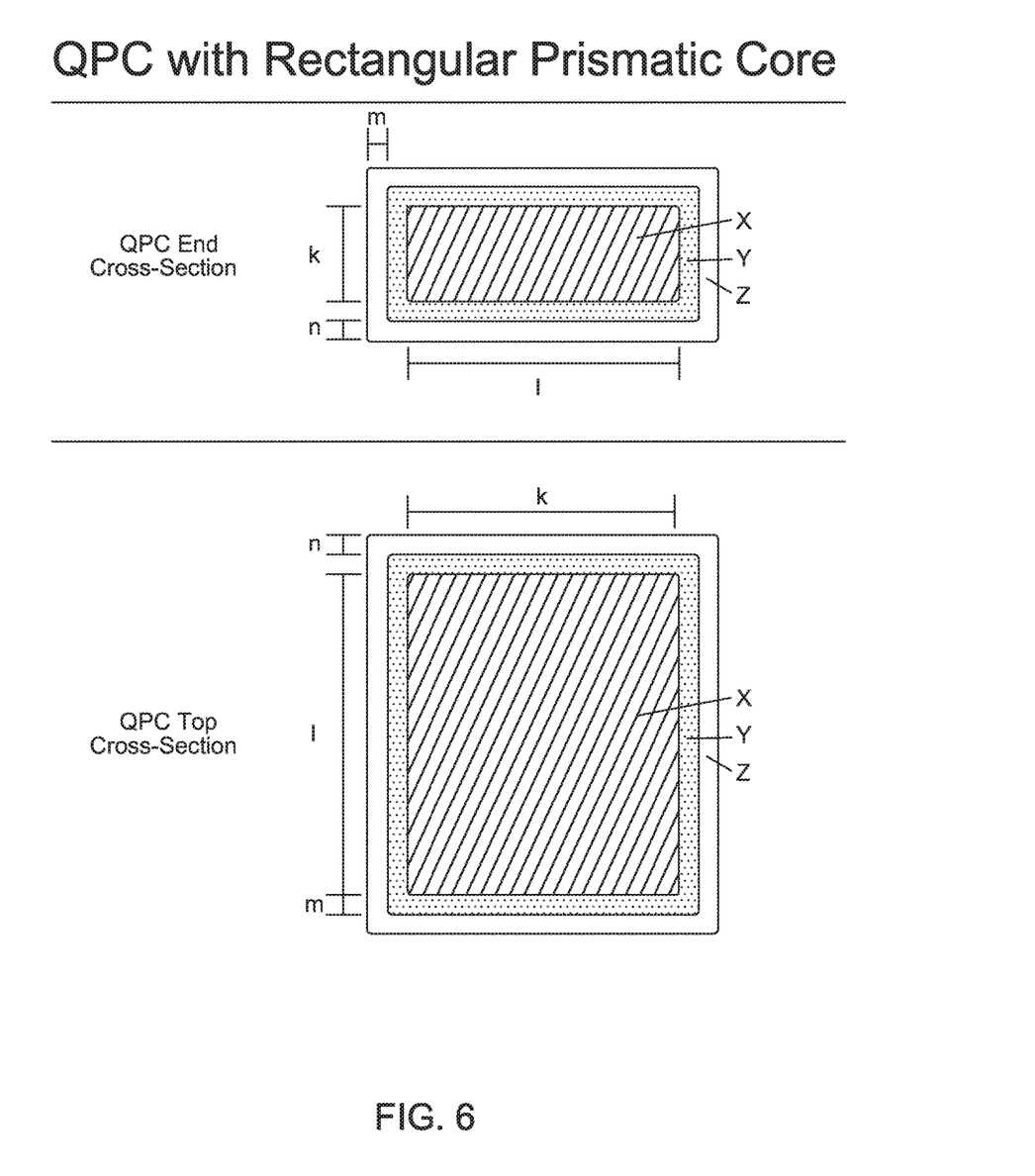
FIG. 6 shows an end cross-section and a top cross-section of another exemplary QDH with a (nanoplatelet or rectangular prismatic core) covered with nanoplatelet shell.

FIG. 6 shows an end cross-section 600 and a top cross-section 610 of another exemplary QDH with a (nanoplatelet or rectangular prismatic core 602) covered with nanoplatelet shell 604. A stabilizing second shell layer 606 covers the nanoplatelet shell 604.

Figure 7:
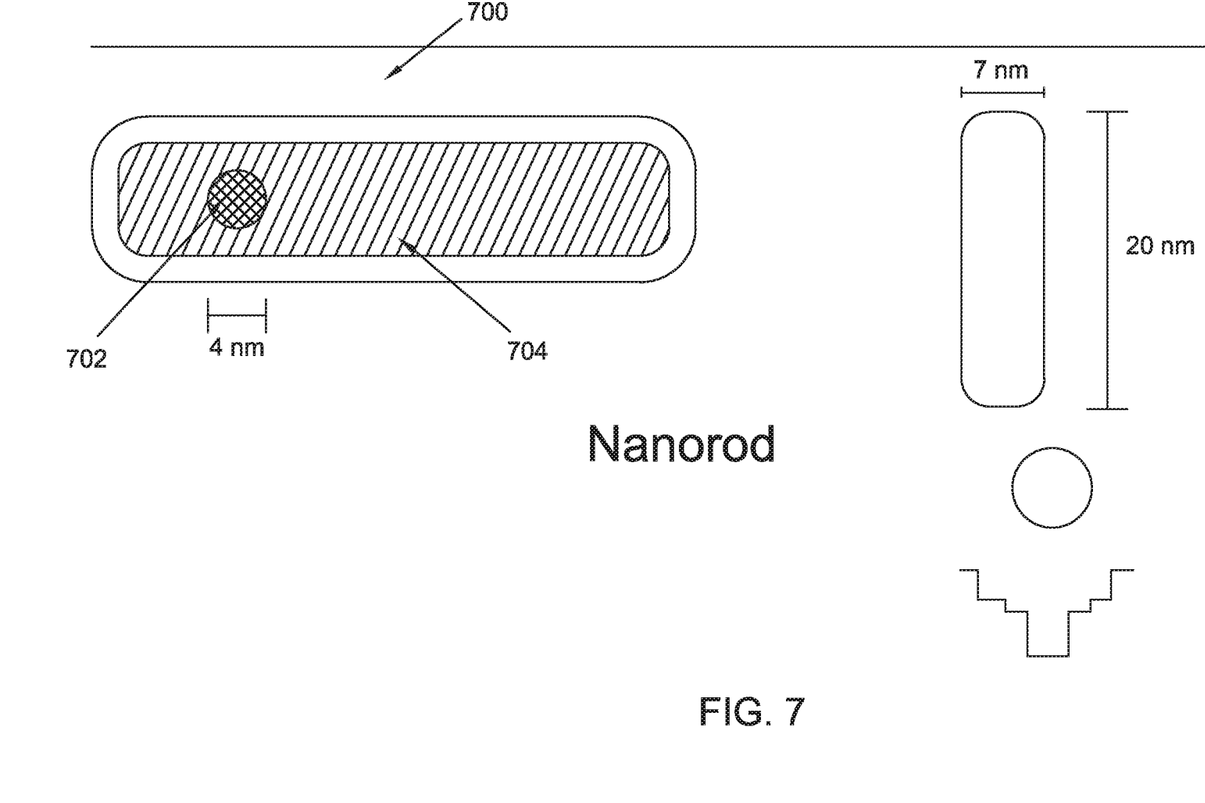
FIG. 7 shows an exemplary quasi-two dimensional nanoplatelet QDH with a nanosphere core covered with a nanorod shell.

FIG. 7 shows an exemplary quasi-two dimensional nanoplatelet QDH 700 with a nanosphere core 702 covered with a nanorod shell 704. FIG. 7 also shows an exemplary size of the QDH 700 having a nanosphere core 702 covered by a nanorod shell 704.

The quasi-two dimensional quantum nanoplatelet structures make it possible to produce 520-nm light emitters for the REC 2020 wide color gamut as specified by ITU-R Recommendation BT.2020. The large size of the quasi-two dimensional quantum nanoplatelet structures allows for a greater absorption cross-section such that less phosphor particles (e.g., quasi-two dimensional quantum nanoplatelet structures) are necessary. Moreover, the quasi-two dimensional quantum nanoplatelet structures can be used to provide for a much narrower FWHM than other materials, which is especially important for InP-based materials. For example, (nanoplatelet) nanoplatelet structure can have FWHM of 10 nm to finely tune the emitted light. The reduction in the FWHM for the (nanoplatelet) nanoplatelet is less than for a simple quantum dot structure of a nanosphere core. While the size of the structure normally governs the narrowness of the FWHM, the physics of the different combinations of the (core)shell structure in the quasi-two dimensional nanoplatelets provides for a synergistic effect beyond a simple relationship to the size.

LED Downconverter Application of Quasi-Two Dimensional Nanoplatelet Heterostructures The disclosed quasi-two dimensional quantum nanoplatelet structures can be used in a light emitting diode (LED) device package as a downconverter. For example, a light transmitting layer, such as a silicon layer, can be embedded with the disclosed quasi-two dimensional quantum nanoplatelet structures as a downconverter. The silicon material embedded with the disclosed quasi-two dimensional quantum nanoplatelet structures can act as an encapsulant to protect the LED device. In addition, silicon can act as a polymer matrix for the disclosed quasi-two dimensional quantum nanoplatelet structures to convert blue light emitted by LEDs in the LED device to green, yellow, and red lights, the mixture of which are perceived as white light, for example.

Figure 8:
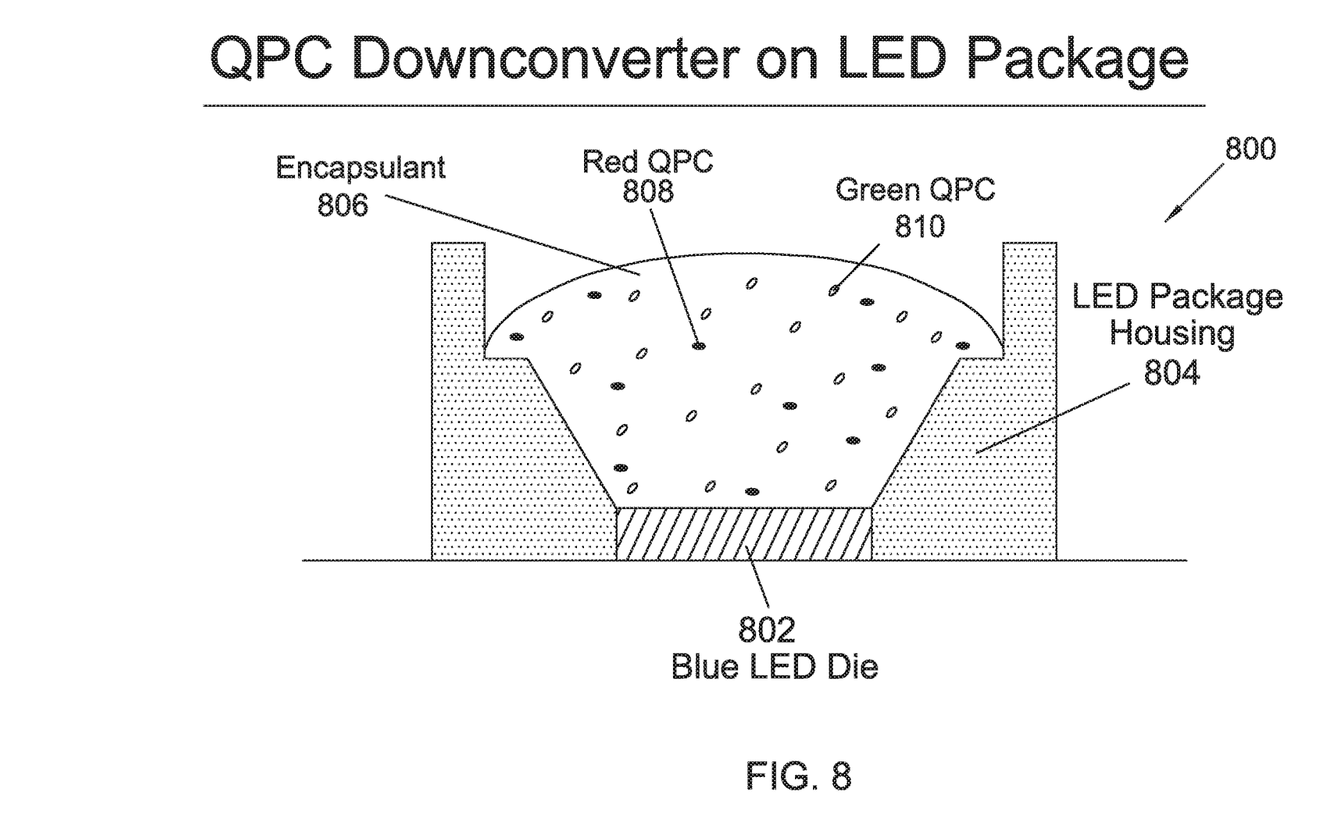
FIG. 8 shows an exemplary LED device that includes a QPC downconverter.

FIG. 8 shows an exemplary LED device 800 that includes a QPC downconverter that converts an LED-emitted light at an emission wavelength to light at a longer wavelength, thus converting light of a higher optical frequency into light of a lower optical frequency. The LED device 800 includes an LED die or chip 802. An encapsulant 806, such as silicon, can be disposed over the LED die or chip 802 that emits UV or blue light. The encapsulant 806 can function as a matrix for holding one or more QPC downconverters 808 and 810. The QPC downconverters 808 can include different QPC structures for down converting the blue light emitted by the LED chip 802 to different longer optical wavelengths, e.g., light in red, green, or yellow colors. For example, the QPC downconverters 808 can include red QPC 808 structures for converting blue light into red light, green QPC 810 structures for converting blue light into green light, yellow QPC structures for converting blue light into yellow light, or combinations of two or all three types of the above QPC structures. The various QPC structures can be embedded into the encapsulant 806 which can include a binder material such as silicon.

When implemented as an on-chip downconverter, the QPC downconverters 808 and 810 embedded into the encapsulant 806 are disposed over the LED die or chip 802 as a part of or an integral part of the LED die or chip 802 and in contact with one or more layers of the LED die 802 to operate as a wavelength converting layer. In some implementations, the QPC downconverters 808 and 810 embedded into the encapsulant 806 are disposed over the LED chip 802 as a remote or separate downconverter, which is not an integral part of the LED chip 802. The LED device 800 can also include an LED package housing 804 for retaining the LED chip 802 along with the QPC downconverters 808 and 810.

The application of QPC as an on-chip or off-chip downconverter can be combined with additional optional features to obtain one or more added synergistic advantages.

Figure 9:
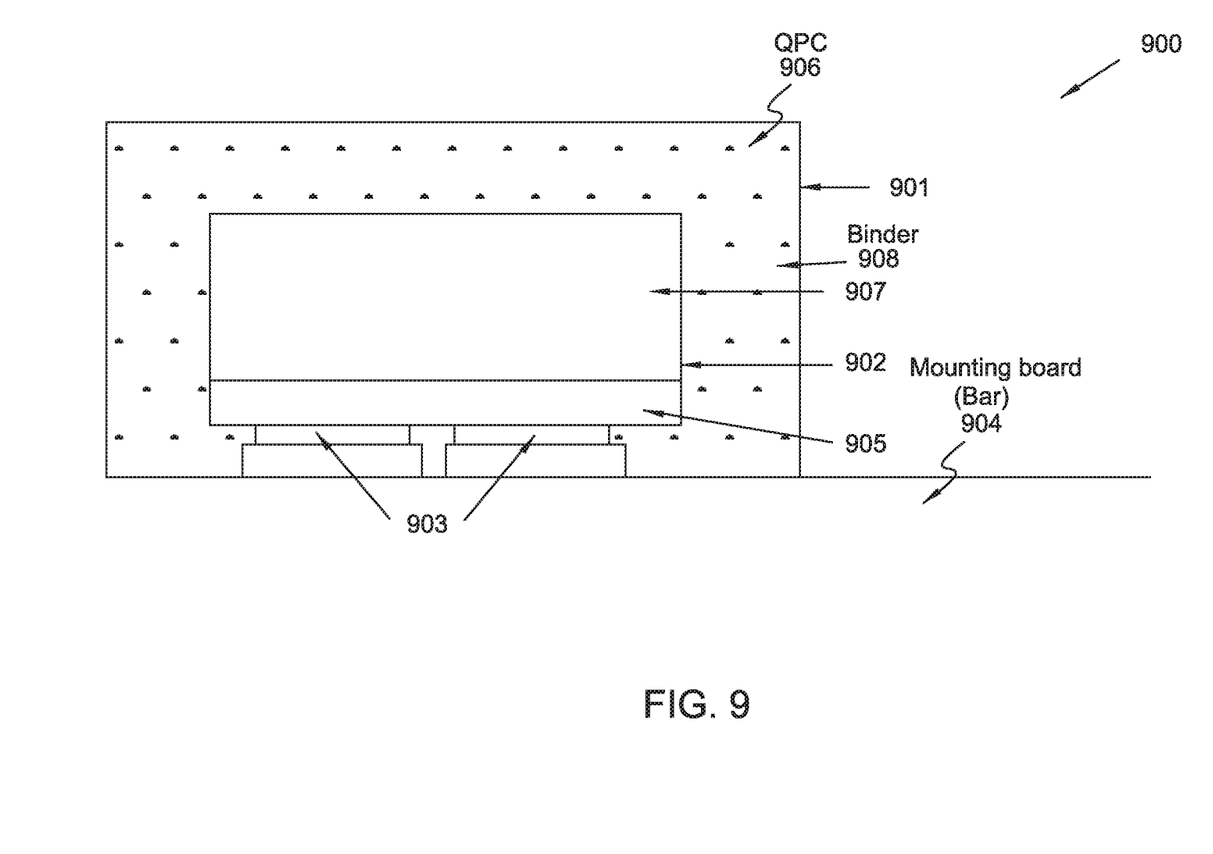
FIG. 9 shows an exemplary LED device for enhancing heat dissipation.

For examples, FIG. 9 shows an exemplary LED device 900 for enhancing heat dissipation. The LED device 900 includes a wavelength converting layer 901 covering an LED chip 902. The wavelength converting layer 901 operates as an encapsulant that functions as a matrix for QPC downconverters 906 for converting light emitted by the LED chip 902 into different wavelengths of light, such as red and green. The LED chip 902 can be electrically connected to a mounting board in some implementations. The wavelength converting layer 901 can be implemented as a phosphor film layer that includes phosphor materials embedded within a binder material 908. For example, various QPC structures 906, such as red emitting QPC and green emitting QPC can be embedded within silicon binder 908. The QPC embedded wavelength converting layer 901 can be disposed to have a uniform thickness on top of the LED chip 902. Although the quasi-2 dimensional structure of the QPC is more robust than quasi-zero or quasi-one dimensional structures, the LED chip 902 can be implemented to have a specific shape for enhancing heat dissipation. The enhanced heat dissipation can provide additional stability to the LED device 900.

The LED chip 902 can be fabricated as a GaN based LED grown on a sapphire substrate 907. For the example shown in FIG. 9, the GaN based LED is fabricated to have a light emitting structure 905 face a bottom surface so that the substrate 907 is over the light emitting structure 905.

Responsive to a current applied to the light emitting structure 905 through metal bump or layers 903, a portion of the energy from the applied current may not be converted into light by the LED device. The lost energy is converted into heat, which can degrade the performance of the QPC 906 embedded wave length converting layer 901. At least some structures of QPC 906 can be more heat sensitive than other phosphor materials due to having a greater percentage of the surface area compared to the core. When the light emitting structure is disposed to face down and close to a current supply layer, the current supply layer can be used as a heat dissipation layer to enhance heat dissipation. To increase the efficiency, the heat dissipation layer can be implemented as metal layers or metal bumps 903, which can be fabricated to have an area that is larger than ½ of an area of the light emitting layer. In addition, heat dissipation can be further improved by having the LED chip 902 directly attached to a module without an LED PKG.

Figure 10A:
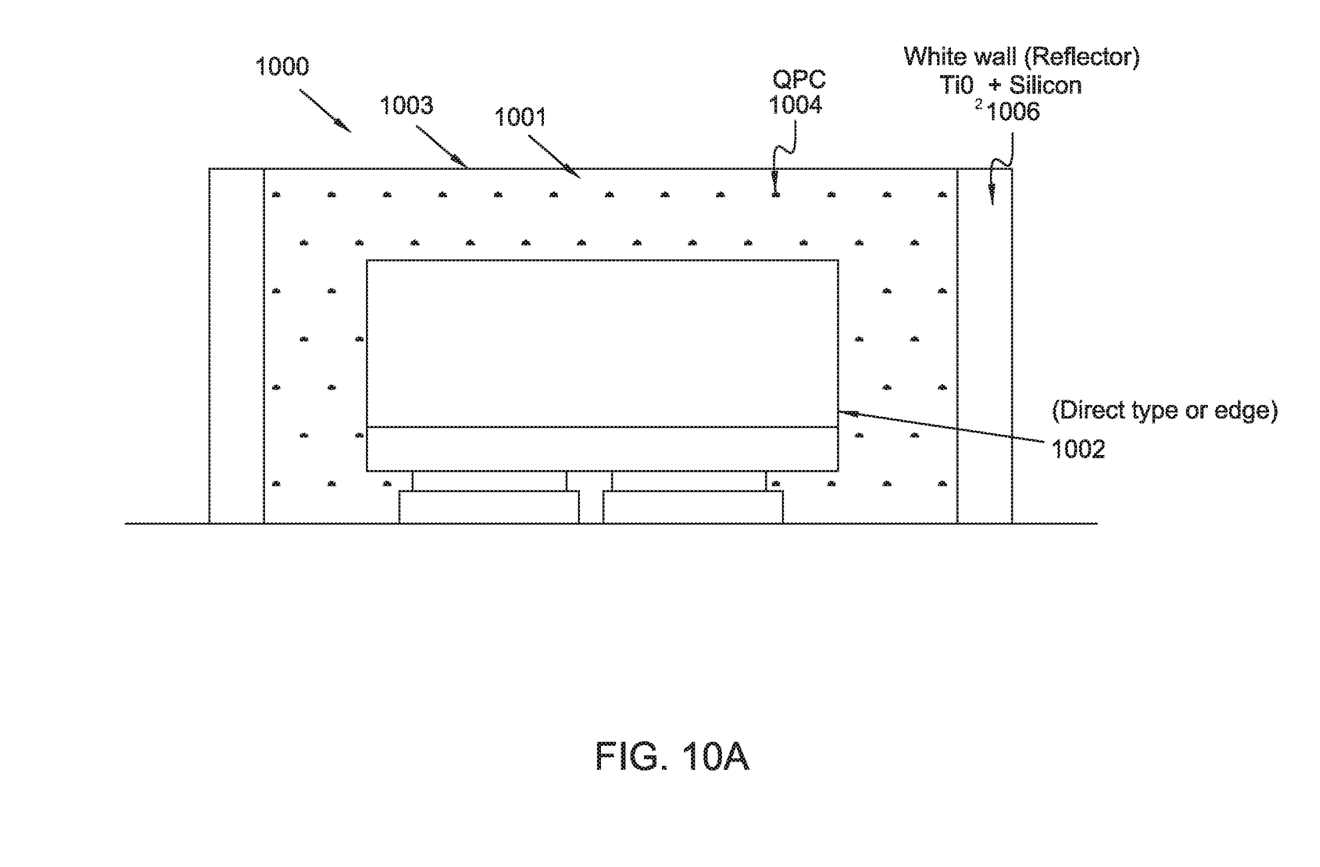
FIGS. 10A and 10B show an exemplary LED device for improving light guidance.
Figure 10B:
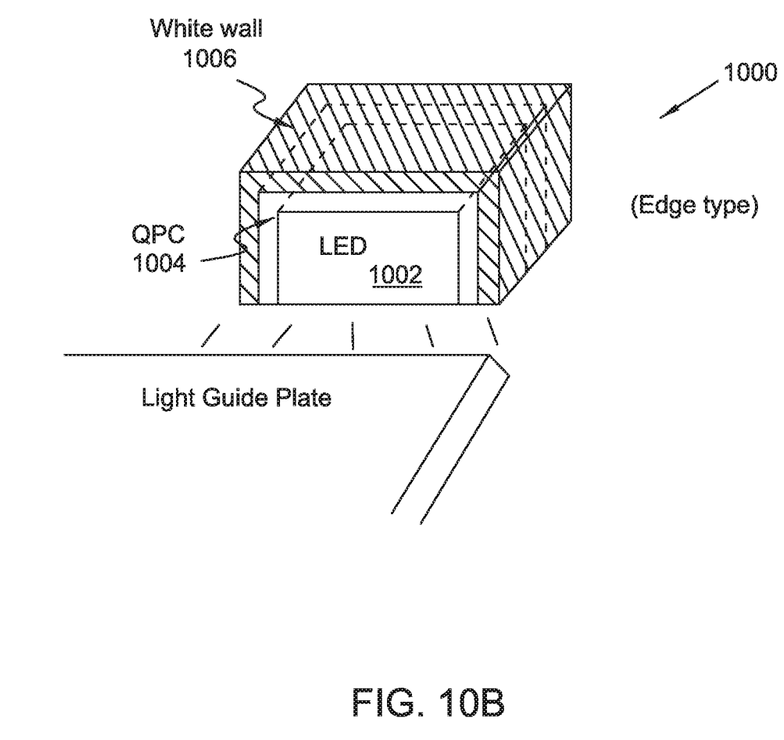

FIGS. 10A and 10B show an exemplary LED device 1000 for improving light guidance. Similar to the LED device 900, the LED device 1000 includes a wavelength converting layer 1003 disposed over an LED chip 1002. The wavelength converting layer 1003 includes quasi-two dimensional QPC structures 1004, such as red QPC and green QPC, embedded within a binder material 1001 (e.g., silicon). The QPC 1004 embedded in the wavelength converting layer 1003 operates as a downconverter for converting light emitted by the LED chip 1002 into different wavelengths of light, such as red and green. In addition, a white wall (i.e., a reflector) 1006 can be disposed to at least partially cover the wavelength converting layer 1004. The reflector 1006 can be used to guide light into specific direction. The reflector 1006 can include materials such as silicone mixed with $TiO_2$.

Figure 11:
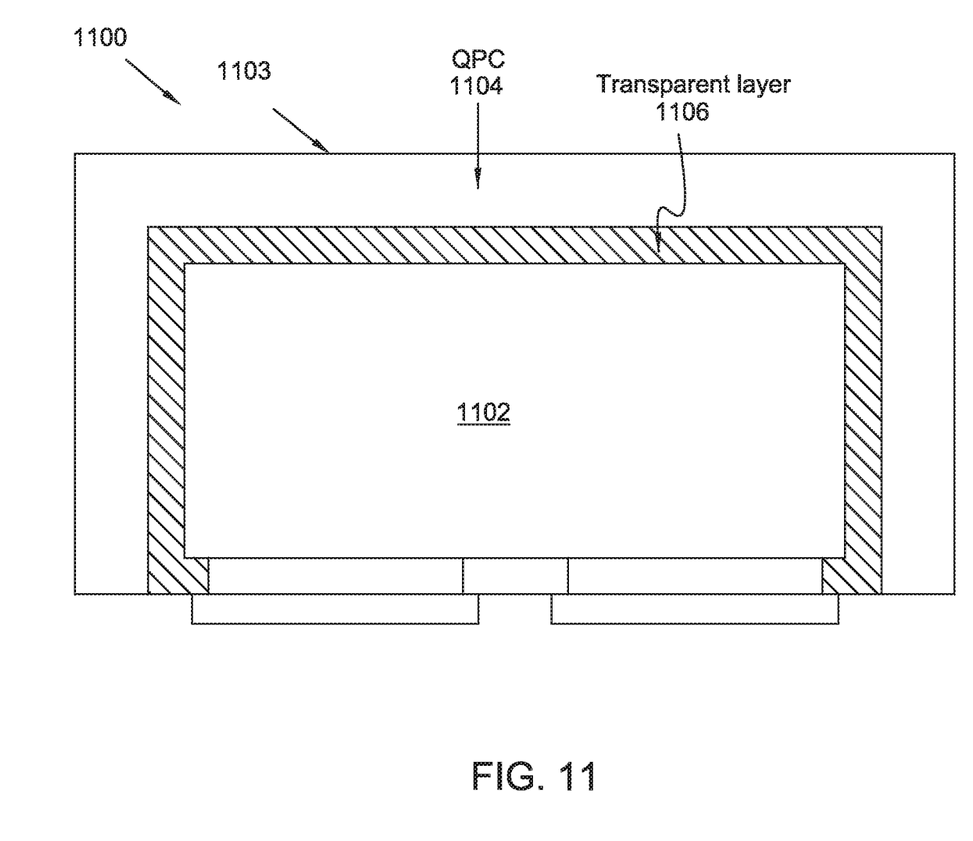
FIG. 11 shows an exemplary LED device for blocking heat.

FIG. 11 shows an exemplary LED device 1100 for blocking heat. Similar to the LED device 900, the LED device 1100 includes a wavelength converting layer 1103 disposed over an LED chip 1102. The wavelength converting layer 1103 includes quasi-two dimensional QPC structures 1104 (e.g., red QPC, green QPC) embedded within a binder material (e.g., silicon). The QPC 1104 embedded within the wavelength converting layer 1103 operates as a downconverter for converting light emitted by the LED chip 1102 (e.g., blue or UV light) into different longer wavelengths of light (e.g., red and green light). In addition, a transparent layer 1106 can be positioned between the QPC embedded wavelength converting layer 1104 and the LED chip 1102. The transparent layer can operate as a heat blocking layer to reduce negative effects of heat on the LED chip 1102.

Figure 12:
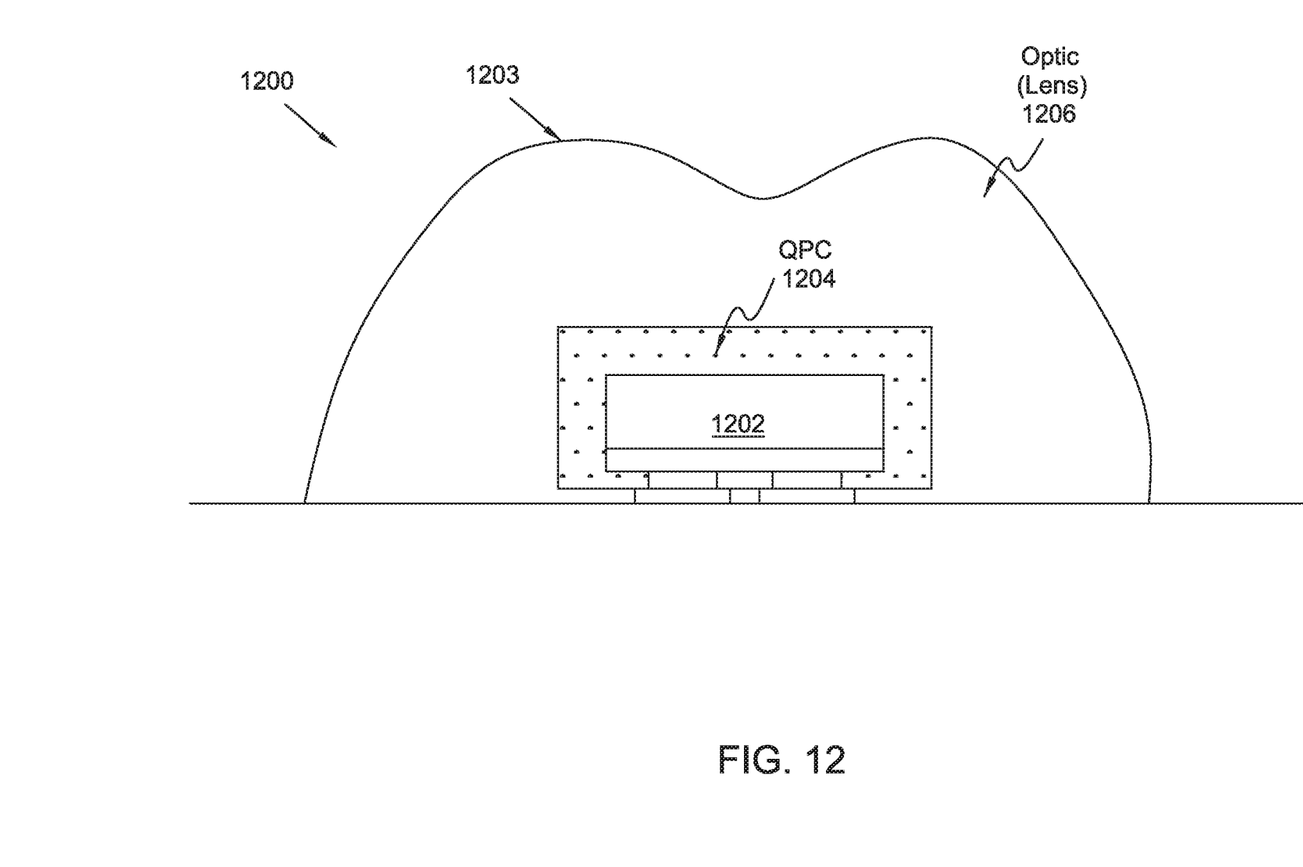
FIG. 12 shows an exemplary LED device with an optical guide.

FIG. 12 shows an exemplary LED device 1200 with an optical guide. Similar to the LED device 900, the LED device 1200 includes a wavelength converting layer 1203 disposed over an LED chip 1202. The wavelength converting layer 1203 includes quasi-two dimensional QPC structures 1204 (e.g., red QPC, green QPC) embedded within a binder material (e.g., silicon). The QPC 1204 embedded within the wavelength converting layer 1203 operates as a downconverter for converting light emitted by the LED chip 1202 into different wavelengths of light, such as red and green. In addition, an optical guide 1206 can be disposed over the QPC 1204 embedded wavelength converting layer 1203. The Optical guide 1206 can include a lens.

Figure 13:
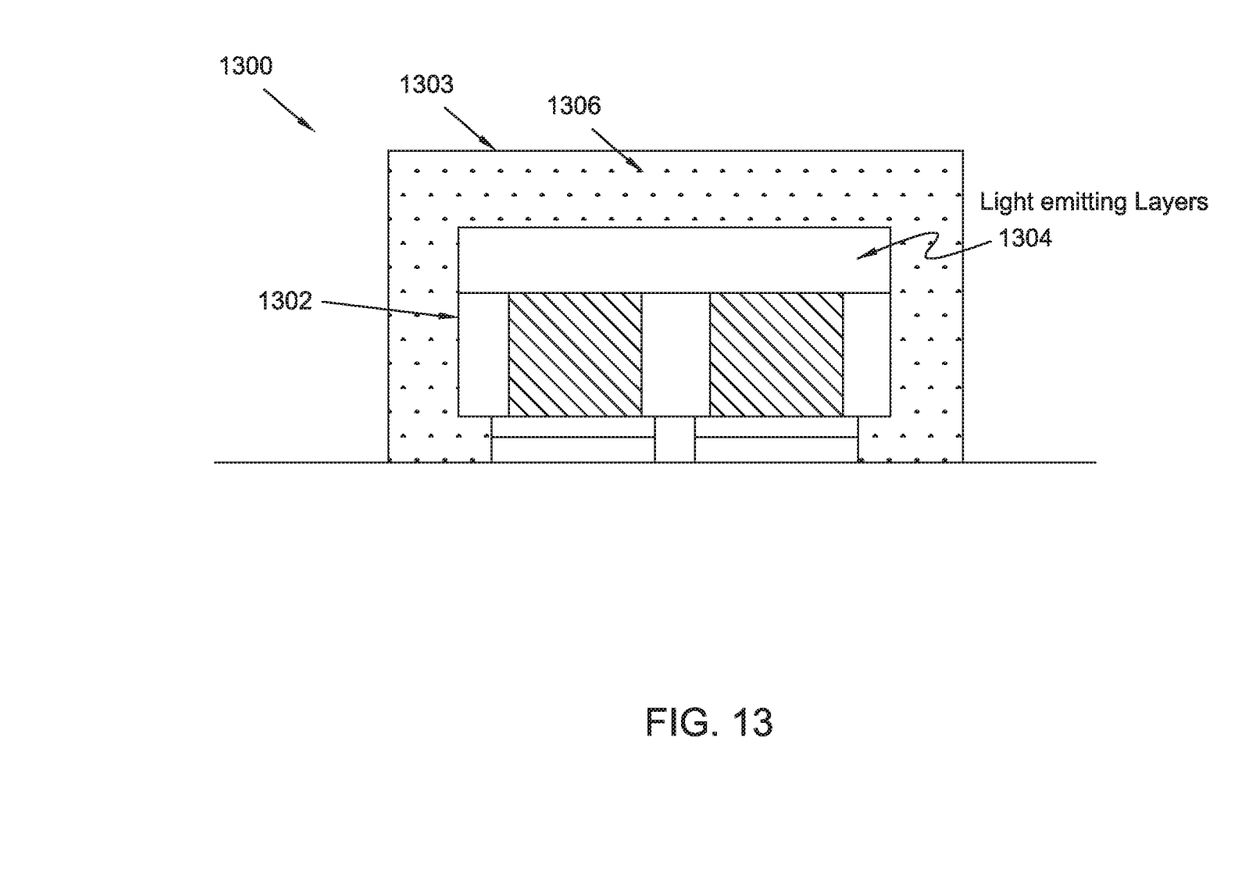
FIG. 13 shows an exemplary LED device with a light emitting structure that faces a wavelength converting layer.

FIG. 13 shows an exemplary LED device 1300 with a light emitting structure that faces a wavelength converting layer. Similar to the LED device 900, the LED device 1300 includes a wavelength converting layer 1303 disposed over an LED chip 1302. The wavelength converting layer 1303 includes quasi-two dimensional QPC structures 1303 (e.g., red QPC, green QPC) embedded within a binder material (e.g., silicon). The QPC 1306 embedded within the wavelength converting layer 1303 operates as a downconverter for converting light emitted by the LED chip 1302 into different wavelengths of light, such as red and green. In LED device 1300, the substrate which was on top of the light emitting structure 1304 can be removed to allow the light emitting structure to face the QPC embedded wavelength converting layer 1304 directly. In some implementations, the QPC embedded wavelength converting layer 1304 can be formed as a plate. The plate of the wavelength converting layer 1304 can be positioned above the LED chip 1302 with one or more adhesive layers disposed between the plate and the LED chip. In some implementations, the plate of the wavelength converting layer 1304 can be positioned above the LED chip 1302 with an air gap between the plate and the LED chip.

Exemplary System Applications

The various LED devices as described according to the disclosed technology can be implemented in a number of lighting system applications. For example, the disclosed LED device can be implemented in various visible lights for home, industrial and automotive purposes. The LED-based visible lights can include LED light bulbs for use in household or industrial lamps and light fixtures. Also, the LED light bulbs can be used in automobiles as head and tail lights.

In addition to visible light systems, the disclosed LED devices can be used as indicators and signs. For example, the down converting QPCs can be used to provide red and green traffic lights, warning lights, and other indicators and signs.

Also, the disclosed LED devices can be used as edge or back lighting systems for lighting various displays. Examples of LED-lighted displays include stationary and portable display devices including televisions, computer monitors, laptop screens, a tablet, and smartphones.

While this patent document contains many specifics, these should not be construed as limitations on the scope of any disclosed technology or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described above should not be understood as requiring such separation in all embodiments.

Only a few embodiments are described. Other embodiments and their variations and enhancements can be made based on what is described and illustrated.

What is claimed are techniques and structures as described and shown, including:

1. A light emitting device, comprising:
    a light emitting diode (LED) chip that emits light of a first wavelength;
    an encapsulant disposed over the LED chip; and
    one or more downconverters embedded in the encapsulant,
    wherein each downconverter includes a quasi-two dimensional quantum nanoplatelet structure that interacts with the emitted light of the first wavelength from the LED chip to produce light of a second wavelength that is longer than the first wavelength,
    wherein the quasi-two dimensional quantum nanoplatelet structure of the downconverter includes a core material covered by at least one nanoplatelet shell, and
    wherein the at least one nanoplatelet shell has a length and a width larger than a height,
    wherein the downconverter includes an on-chip downconverter that is formed as a part of the LED chip.

2. The light emitting device of claim 1, wherein the downconverter is configured to down convert a blue light emitted by the LED chip to at least one of red, yellow, or green lights.

3. The light emitting device of claim 1, wherein the downconverter includes a remote or separate downconverter.

4. The light emitting device of claim 1, wherein the quasi-two dimensional quantum nanoplatelet structure of the downconverter includes a nanosphere core covered by the nanoplatelet shell.

5. The light emitting device of claim 1, wherein the quasi-two dimensional quantum nanoplatelet structure of the downconverter includes a nanoplatelet core covered by a nanoplatelet shell.

6. The light emitting device of claim 1, wherein the quasi-two dimensional quantum nanoplatelet structure of the downconverter includes a nanorod core covered by the nanoplatelet shell.

7. The light emitting device of claim 1, wherein the quasi-two dimensional quantum nanoplatelet structure includes a cadmium-based material.

8. The light emitting device of claim 7, wherein the cadmium-based material includes: ((CdSe)CdS)ZnS;
    ((CdSe)CdZnS)ZnS;
    (CdSe)CdS; or
    (CdSe)ZnS.

9. The light emitting device of claim 1, wherein the quasi-two dimensional quantum nanoplatelet structure includes a cadmium-free material.

10. The emitting device of claim 9, wherein the cadmium-free material includes:
    ((InP)GaP)ZnS;
    (InP)GaP;
    (InP)ZnS;
    ((InP)InGaP)ZnS; or
    (InP)InGaP.

11. A light emitting device, comprising:
    a light emitting diode (LED) chip including a substrate, and a light emitting structure disposed over a surface of the substrate and operable to emit light of a first optical wavelength;
    an encapsulant disposed over the LED chip; and
    a downconverter embedded in the encapsulant and including an on-chip downconverter that is formed as a part of the LED chip,
    wherein the downconverter includes a quasi-two dimensional quantum nanoplatelet structure that converts light of the first optical wavelength from the LED chip into light of a second optical wavelength longer than the first optical wavelength,
    wherein the quasi-two dimensional quantum nanoplatelet structure of the downconverter includes a core material covered by at least one nanoplatelet shell, and
    wherein the at least one nanoplatelet shell has a length and a width larger than a height.

12. The light emitting device of claim 11, wherein the light emitting structure is disposed on a bottom surface of the substrate.

13. The light emitting device of claim 11, comprising a heat dissipation metal structure disposed to be in contact with the light emitting structure.

14. The light emitting device of claim 13, wherein the heat dissipation metal structure is electrically connected to a current supply to apply a current to the light emitting structure.

15. The light emitting device of claim 11, comprising a reflector structure disposed to cover at least a portion of the encapsulant, the reflector structure configured to guide light in a given direction.

16. A light emitting device, comprising:
    a substrate;
    a light emitting structure disposed over a surface of the substrate; and
    a wavelength converting layer disposed over the light emitting structure, wherein the wavelength converting layer includes a quasi-two dimensional quantum nanoplatelet structure,
    wherein the quasi-two dimensional quantum nanoplatelet structure of the downconverter includes a core material covered by at least one nanoplatelet shell, and
    wherein the at least one nanoplatelet shell has a length and a width larger than a height, wherein the light emitting device comprises a transparent layer disposed between the wavelength converting layer and the light emitting structure.

17. The light emitting device of claim 16, comprising an optical guide disposed over the wavelength converting layer.

* * * * *